(12) United States Patent
Bao et al.

(10) Patent No.: US 9,589,806 B1
(45) Date of Patent: Mar. 7, 2017

(54) INTEGRATED CIRCUIT WITH REPLACEMENT GATE STACKS AND METHOD OF FORMING SAME

(71) Applicant: GLOBALFOUNDRIES Inc., Grand Cayman (KY)

(72) Inventors: Ruqiang Bao, Wappingers Falls, NY (US); Unoh Kwon, Fishkill, NY (US); Huihang Dong, Ridgefield, CT (US); John A. Fitzsimmons, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/886,424

(22) Filed: Oct. 19, 2015

(51) Int. Cl.
| | | |
|---|---|---|
| *H01L 21/28* | (2006.01) | |
| *H01L 21/283* | (2006.01) | |
| *H01L 21/8238* | (2006.01) | |
| *H01L 27/092* | (2006.01) | |
| *H01L 29/49* | (2006.01) | |

(52) U.S. Cl.
CPC .... *H01L 21/283* (2013.01); *H01L 21/823828* (2013.01); *H01L 27/092* (2013.01); *H01L 29/4966* (2013.01)

(58) Field of Classification Search
None
See application file for complete search history.

(56) References Cited

U.S. PATENT DOCUMENTS

| | | | | |
|---|---|---|---|---|
| 2008/0173947 A1* | 7/2008 | Hou | ............... | H01L 21/823835 257/369 |
| 2010/0072523 A1* | 3/2010 | Sato | ................. | H01L 21/28088 257/289 |
| 2010/0124818 A1* | 5/2010 | Lee | ................. | H01L 21/823807 438/589 |
| 2011/0081774 A1* | 4/2011 | Yeh | ................. | H01L 21/823835 438/591 |
| 2011/0189847 A1* | 8/2011 | Tsai | ....................... | H01L 21/28 438/595 |
| 2012/0146142 A1* | 6/2012 | Zhu | .................... | H01L 29/78609 257/347 |
| 2012/0319214 A1* | 12/2012 | Ma | ................... | H01L 21/823842 257/410 |

(Continued)

*Primary Examiner* — Michael Lebentritt
*Assistant Examiner* — Jordan Klein
(74) *Attorney, Agent, or Firm* — Yuanmin Cai; Hoffman Warnick LLC (57) ABSTRACT

An IC structure including: a first replacement gate stack for the pFET, the first replacement gate stack including: an interfacial layer in a first opening in the dielectric layer; a high-k layer over the interfacial layer in the first opening; a pFET work function metal layer over the high-k layer in the first opening; and a first gate electrode layer over the pFET work function metal layer and substantially filling the first opening; and a second replacement gate stack for the nFET, the second gate stack laterally adjacent to the first gate stack and including: the interfacial layer in a second opening in the dielectric layer; the high-k layer over the interfacial layer in the second opening; a nFET work function metal layer over the high-k layer in the second opening; and a second gate electrode layer over the nFET work function metal layer and substantially filling the second opening.

13 Claims, 10 Drawing Sheets

(56) References Cited

U.S. PATENT DOCUMENTS

2012/0329262 A1* 12/2012 Na ................. H01L 21/823842
    438/595
2013/0260549 A1* 10/2013 Jagannathan ..... H01L 21/28518
    438/592
2014/0051240 A1*  2/2014 Choi ................. H01L 29/4966
    438/592

* cited by examiner

INTEGRATED CIRCUIT WITH REPLACEMENT GATE STACKS AND METHOD OF FORMING SAME

BACKGROUND

Technical Field

The present disclosure relates to gate stacks, and more particularly, to replacement gate stacks for p-type field-effect transistors and n-type field effect transistors and methods of forming the same.

Related Art

During integrated circuit fabrication, transistors can be formed in a semiconductor substrate. Each transistor includes a gate through which a current can be passed to change the between source and drain terminals of the transistor. One approach to forming gates includes replacement metal gate (RMG) processing. RMG processing includes generating a number of sacrificial or dummy gates over a structure, such as a fin for a fin field effect transistor (FINFET), so that other processing steps, such as adjacent contact creation, can be carried out without damaging the gate. Once the other processing is carried out, the dummy gates are replaced with a metal to create the final metal gate structure. One challenge associated with RMG processing is reducing total gate resistance in a complementary metal-oxide-semiconductor (CMOS) formed by a p-type field-effect transistor and by a n-type field-effect transistor without affecting work function of the gate stack metals used to form the gate stacks.

SUMMARY

A first aspect of the disclosure relates to a method of forming a replacement gate stack for a p-type field-effect transistor (pFET) and a n-type field-effect transistor (nFET). The method may include: forming an interfacial layer in a first opening over a pFET region and a second opening over a nFET region, each of the first and second openings being positioned in a dielectric layer over the pFET region and the nFET region; forming a high-k layer over the interfacial layer in each opening; forming a pFET work function metal layer over the high-k layer in each opening; forming a first gate electrode layer over the pFET work function metal layer to substantially fill each of the first and second openings, thereby forming a first replacement gate stack for the pFET; removing the first gate electrode layer from the second opening; forming a nFET work function metal layer in the second opening; and forming a second gate electrode layer over the nFET work function metal layer, thereby forming a second replacement gate stack for the nFET.

A second aspect of the disclosure relates to an integrated circuit (IC) structure. The IC structure may include: a first replacement gate stack for the pFET, the first replacement gate stack including: an interfacial layer in a first opening in the dielectric layer; a high-k layer over the interfacial layer in the first opening; a pFET work function metal layer over the high-k layer in the first opening; and a first gate electrode layer over the pFET work function metal layer and substantially filling the first opening; and a second replacement gate stack for the nFET, the second gate stack laterally adjacent to the first gate stack and including: the interfacial layer in a second opening in the dielectric layer; the high-k layer over the interfacial layer in the second opening; a nFET work function metal layer over the high-k layer in the second opening; and a second gate electrode layer over the nFET work function metal layer and substantially filling the second opening.

BRIEF DESCRIPTION OF THE DRAWINGS

The embodiments of this disclosure will be described in detail, with reference to the following figures, wherein like designations denote like elements, and wherein.

DETAILED DESCRIPTION

The present disclosure relates to gate stacks, and more particularly, to replacement gate stacks for p-type field-effect transistors and n-type field effect transistors and methods of forming the same. Specifically, the replacement gate stacks of the present disclosure reduce pFET and nFET gate resistance, without affecting work function of gate stack metals used to form the gate stacks.

Figure 1:
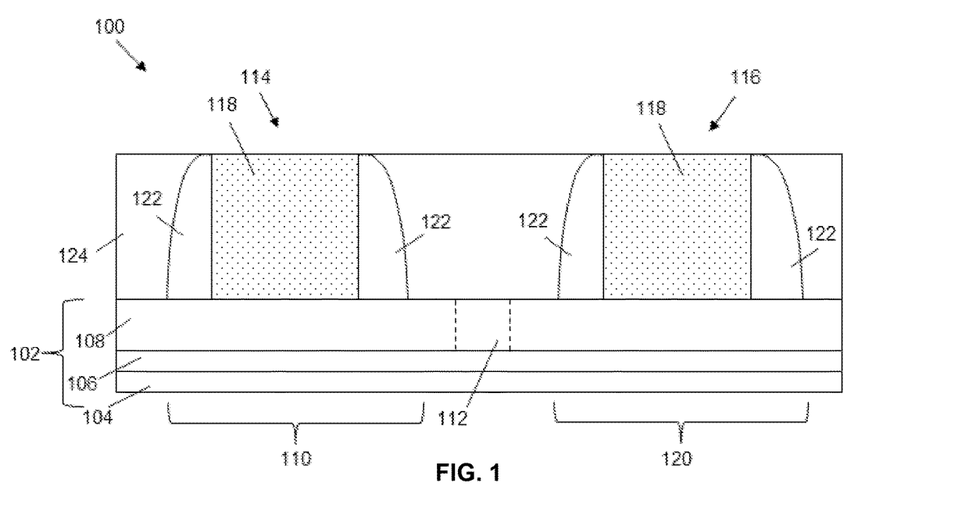
FIGS. 1-12 each show a cross-sectional view of a p-type field-effect transistor and a n-type field-effect transistor undergoing aspects of the method as described herein.

FIGS. 1-12 show a cross-section of an integrated circuit (IC) structure 100 undergoing methods of the present disclosure as will be described herein. FIG. 1 shows an initial IC structure 100 that has undergone preliminary steps leading up to the methods according to embodiment of the disclosure. IC structure 100 may include a n-type field effect transistor (nFET) region 110 and a p-type field-effect transistor (pFET) region 120. PFET region 120 and nFET region 110 may be laterally adjacent to one another on a substrate 102. It will be understood that when an element as a layer, region or substrate is referred as being "on" or "over" another element, it can be directly on the other element or intervening elements may be present. It will also be understood that when an element is referred to as being "connected" or "coupled" to another element, it can be directly connected or couple to the other element or intervening elements may be present. Substrate 102 may include a semiconductor layer 104, having a buried insulator (e.g., buried oxide (BOX) layer 106 and a semiconductor-on-insulator (SOI) layer 108. Semiconductor layer 104 or SOI layer 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). SOI layer 108 is segmented by trench isolations 112, e.g. of silicon oxide. NFET region 110 and PFET region 120 may otherwise include any now known or later developed structures or materials associated with an area in which an NFET or PFET, respectively, would be generated.

IC structure 100 also includes a plurality of gates 114 and 116. Gates 114 and 116 will be described as dummy gates (also referred to as "sacrificial gates") in a replacement metal gate (RMG) processing setting. It is emphasized, however, that the teachings of the disclosure may be applied to non-dummy gates, e.g., polysilicon gates. That is, the disclosure has applicability beyond just RMG applications as will be apparent to those with skill in the art. As understood, gates 114, 116 implemented as dummy gates may include a sacrificial material 118 adjacent to which a spacer 122 is formed. Substrate 102 may include doped regions (not shown) that may constitute the other parts of a transistor. An interlayer dielectric (ILD) layer 124 may be deposited over gates 114, 116. Gates 114, 116 in the form of dummy gates allow other processing steps, as will be described, such as adjacent contact creation, to be carried out without damaging an eventual metal gate that will replace the dummy gate.

Sacrificial material 118 may include any now known or later developed material capable of withstanding the processing to which it is exposed, such as but not limited to silicon nitride, any oxide, polysilicon, etc. Spacers 122 may include any conventional spacer material such as but not limited to: SiOCN, SiBCN, SiCN, and Si3N4. Gates 114, 116 in the form of dummy gates may be formed using any now known or later developed semiconductor processing techniques, e.g., deposition of polysilicon, patterning and etching thereof, deposition of silicon nitride, etching thereof, etc. ILD layer 124 may be deposited there over and planarized, e.g., chemical mechanical polishing (CMP). Although a certain number of gates have been illustrated, it is understood that many more gates may be present.

"Depositing," as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In one embodiment, ILD layer 124 may include a flowable chemical vapor deposited (FCVD) oxide, e.g., silicon oxide ($SiO_2$). However, ILD layer 124 may include other materials such as but not limited to: silicon nitride ($Si_3N_4$), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Figure 2:
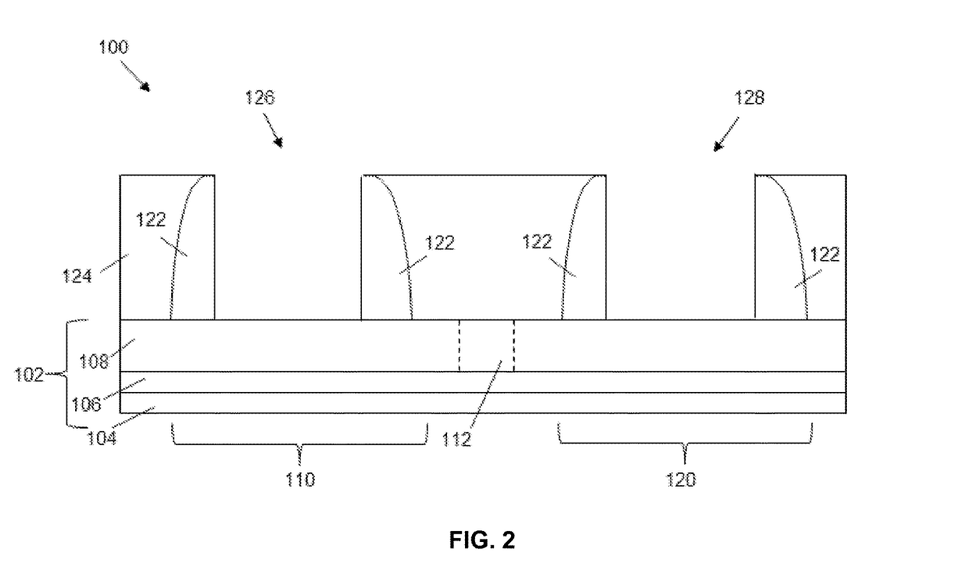
Figure 3:
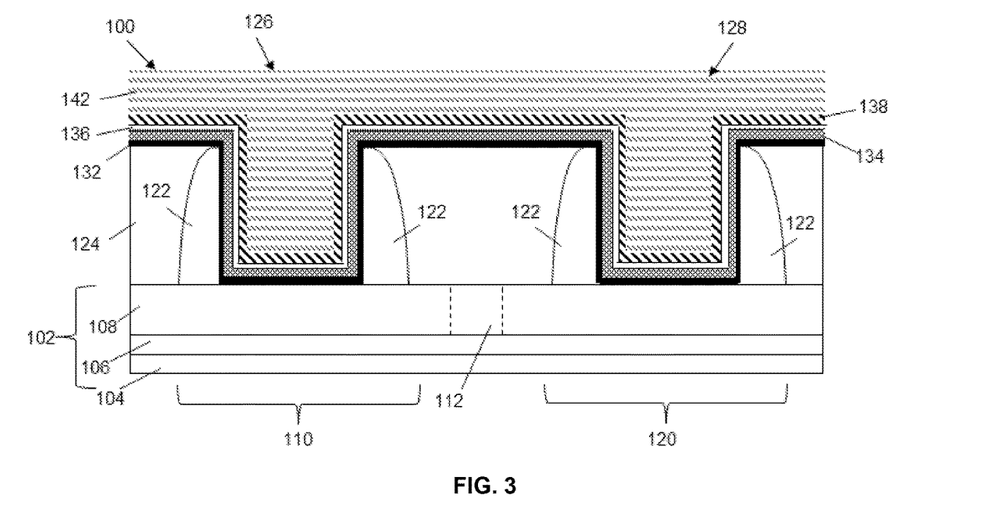

Referring now to FIGS. 1-2 together, gates 114, 116 may be removed to create openings 126, 128 in ILD layer 124 in which replacement gate stacks may be formed as will be described herein. That is, sacrificial material 118 of gates 114, 116 may be removed by an etch selective to sacrificial material 118 leaving openings 126, 128. Opening 126 may be over nFET region 110, and opening 128 may be over pFET region 120. Referring to FIG. 3, an interfacial layer 132 may be formed in each opening 126, 128. That is, an interfacial layer 132 may be formed over IC structure 100, e.g. deposited or grown, such that interfacial layer 132 substantially coats each opening 126, 128. As such herein, "substantially" refers to largely, for the most part, entirely specified or any slight deviation which provides the same technical benefits of the disclosure. Interfacial layer 132 may include, but is not limited to: silicon oxide ($SiO_2$) and silicon germanium oxide ($Si_xGe_yO_z$).

Still referring to FIG. 3, a layer of material with a high dielectric constant (high-k layer) 134 may be formed, e.g., deposited or grown, over interfacial layer 132. High-k layer 134 may include but is not limited to: hafnium oxide ($HfO_2$), or high dielectric constant (>3.9) materials. After, formation of interfacial layer 132 and high-k layer 134, a thermal treatment process may be performed, such as a laser anneal, to improve the quality of high-k layer 134 and interfacial layer 132. Optionally, a high-k cap layer 136 may be formed over high-k layer 134. High-k cap layer 136 may include, but is not limited to: titanium nitride (TiN), tantalum nitride (TaN), and combinations thereof. Further, a pFET work function metal layer 138 may be formed over high-k cap layer 136, or directly over high-k layer 134 in an embodiment where high-k cap layer 136 is not included. PFET work function metal layer 138 may include, but is not limited to: titanium nitride (TiN). As also shown in FIG. 3, a gate electrode layer 142 may be formed over pFET work function metal layer 138 to substantially fill each opening 126, 128. Gate electrode layer 142 may include, but is not limited to: tungsten (W), titanium nitride (TiN), and aluminum (Al).

Figure 4:
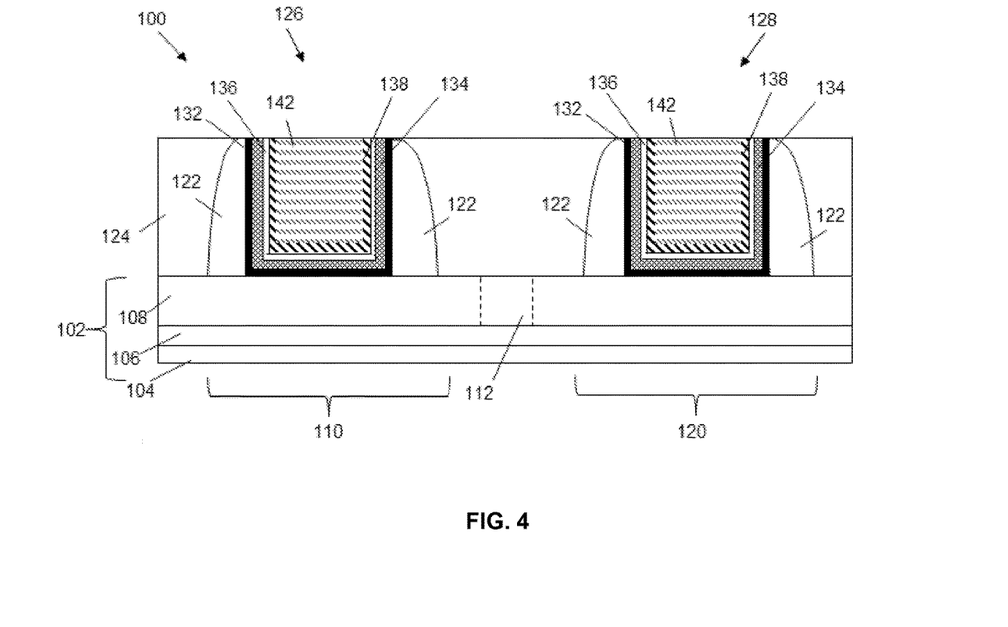

As shown in FIG. 4, IC structure 100 may be planarized such that any material outside of openings 126, 128 is removed and layers 132, 134, 136, 138, 142 are polished to align with a top surface of ILD layer 124. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 5:
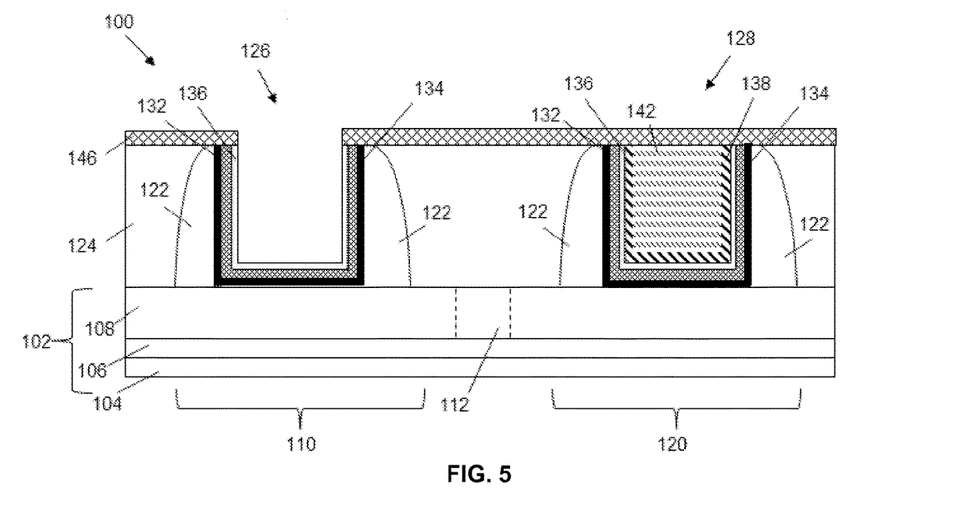

Turning to FIG. 5, a mask 146 may be formed over IC structure 100 and patterned to expose opening 126 over nFET region 110. In one embodiment, as shown in FIG. 5, both gate electrode layer 142 and pFET work function metal layer 138 may be removed from opening 126 over nFET region 110 to expose high-k cap layer 136, or in an embodiment where high-k cap layer is not included, high-k layer 134.

Figure 6:
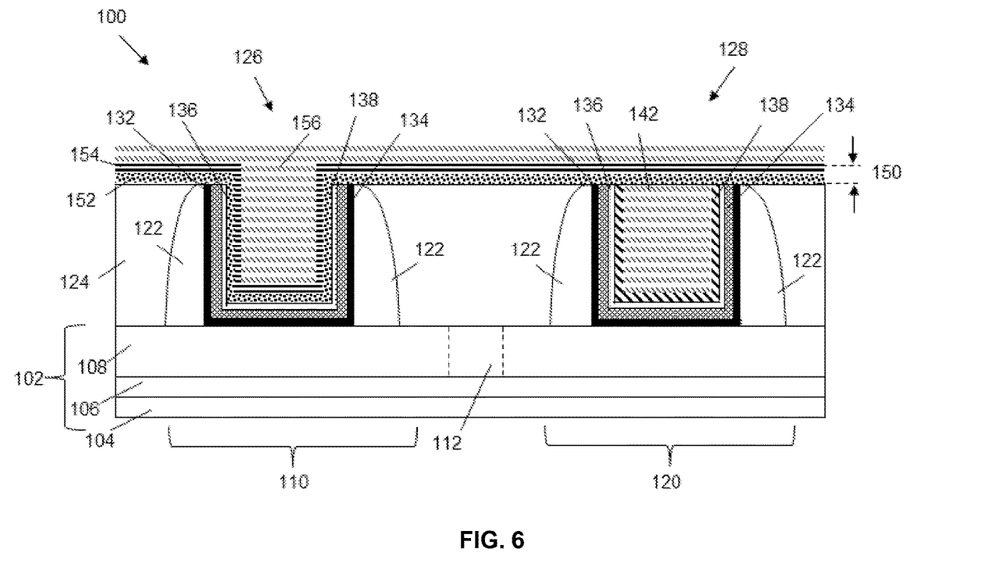

As shown in FIG. 6, mask 146 may be removed and an nFET work function metal layer 150 may be formed over IC structure 100. NFET work function metal layer 150 may include a nFET metal layer 152 and a wetting layer 154. nFET metal layer 152 may include, but is not limited to: titanium aluminum (TiAl), aluminum (Al), titanium aluminum carbon (TiAlC), and titanium (Ti). Wetting layer 154 may include, but is not limited to: titanium nitride (TiN). NFET work function metal layer 150 may be formed over the exposed high-k cap layer 136, or where high-k cap layer 136 is not included, directly over high-k layer 13. That is, nFET metal layer 152 may be formed over either high-k cap layer 136 or high-k layer 134. Wetting layer 154 may be formed over nFET metal layer 152 such that wetting layer 154 and nFET metal layer 152 together define nFET work function metal layer 150. After nFET metal work function layer 150 is formed, another gate electrode layer 156 may be formed over nFET metal work function layer 150 or more particularly, wetting layer 154, to substantially fill opening 126. Gate electrode layer 156 may include any of the gate electrode layer materials discussed with respect to gate electrode layer 142.

Figure 7:
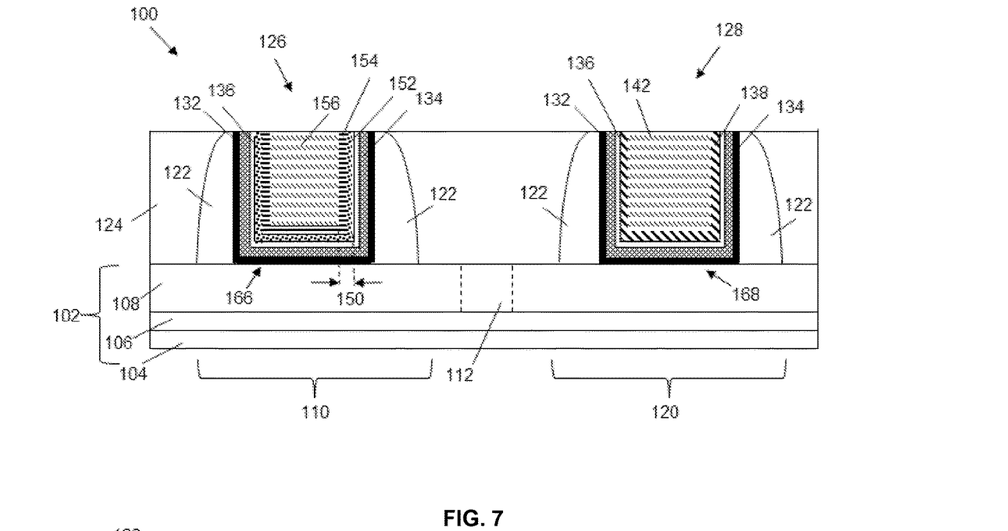

Referring now to FIG. 7, after gate electrode layer 156 is formed, IC structure 100 may be planarized such that any material outside of openings 126, 128 is removed. The resulting gate stacks (hereinafter, "replacement gate stacks") 166, 168 in nFET region 110 and pFET region 120 are of distinct compositions. Replacement gate stack 168 in pFET region 120 includes interfacial layer 132 in opening 128 within ILD layer 124, high-k layer 134 over interfacial layer 132, high-k cap layer 136 over high-k layer 134, pFET work function metal layer 138 over high-k cap layer 136, and gate electrode layer 142. Replacement gate stack 166 in nFET region 110 includes interfacial layer 132 in opening 126 within ILD layer 124, high-k layer 134 over interfacial layer 132, high-k cap layer 136 over high-k layer 134, nFET work function metal layer 150 over high-k cap layer 136, and gate electrode layer 156. As discussed herein, nFET work function metal layer 150 may include nFET metal layer 152 over high-k cap layer 136 and wetting layer 154 over nFET metal layer 152. As also discussed herein, high-k cap layer 136 is optional and may not be included in some embodiments.

It is to be understood that gate electrode layer 142 and gate electrode layer 156 may be of the same composition or different compositions. For example, in one embodiment, gate electrode layer 142 may include tungsten (W) and gate electrode layer 156 may include titanium nitride (TiN). In another embodiment, gate electrode layer 142 may include tungsten (W) and gate electrode layer 156 may include aluminum (Al).

Figure 8:
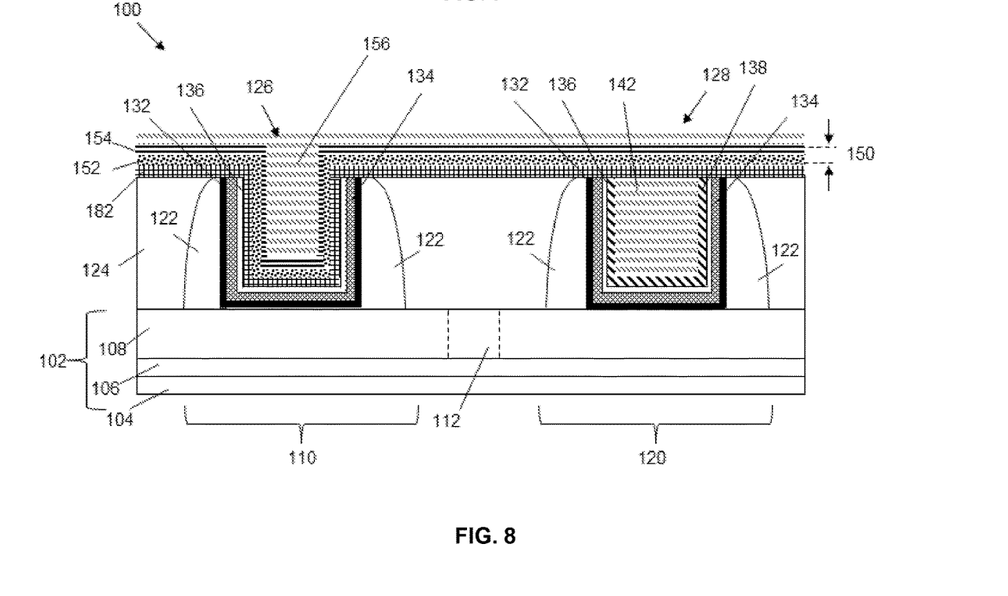
Figure 9:
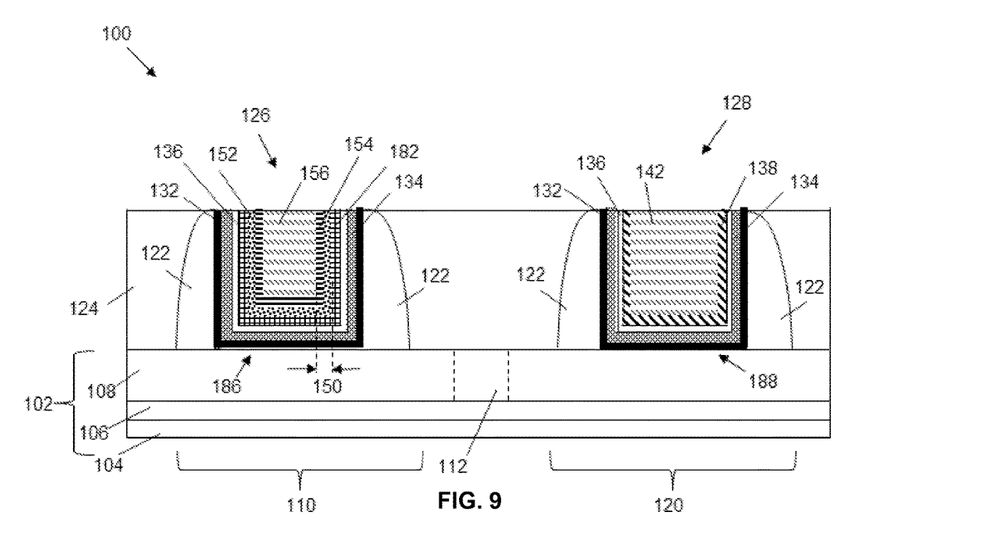

FIGS. 8-9 show an alternative embodiment to that which is shown in FIGS. 6-7. In this embodiment, a barrier layer 182 may be formed after the removal of gate electrode 142 and pFET work function metal layer 138 from opening 126 as discussed herein with respect to FIG. 5. As shown in FIG. 8, prior to forming nFET work function metal layer 150, a barrier layer 182 may be formed over high-k cap layer 136, or over high-k layer 134 in an embodiment where high-k cap layer 136 is not included. After barrier layer 182 is formed, nFET work function metal layer 150 may be formed over barrier layer 182. That is, nFET metal layer 152 may be formed over barrier layer 182 and wetting layer 154 may be formed over nFET metal layer 152. After nFET work function metal layer 150 is formed, gate electrode layer 156 may be formed as described herein. As shown in FIG. 9, IC structure 100 may undergo a planarization technique such that any material outside of openings 126, 128 is removed.

In this embodiment, the resulting replacement gates stacks 186, 188 in nFET region 110 and pFET region 120 are of distinct compositions. Replacement gate stack 188 in pFET region 120 includes interfacial layer 132 in opening 128 within ILD layer 124, high-k layer 134 over interfacial layer 132, high-k cap layer 136 over high-k layer 134, pFET work function metal layer 138 over high-k cap layer 136, and gate electrode layer 142. Replacement gate stack 186 in nFET region 110 includes interfacial layer 132 in opening 126 within ILD layer 124, high-k layer 134 over interfacial layer 132, high-k cap layer 136 over high-k layer 134, barrier layer 182 over high-k cap layer 136, nFET work function metal layer 150 over barrier layer 182, and gate electrode layer 156. As discussed herein, nFET work function metal layer 150 may include an nFET metal layer 152 over high-k cap layer 136 and wetting layer 154 over nFET metal layer 152. As also discussed herein, high-k cap layer 136 is optional and may not be included in some embodiments.

Figure 10:
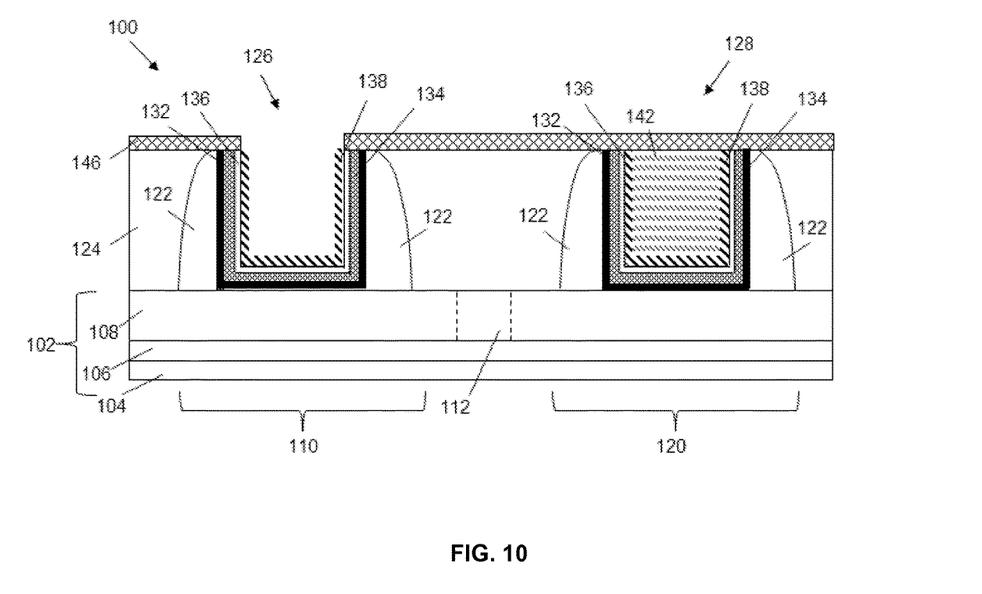
Figure 11:
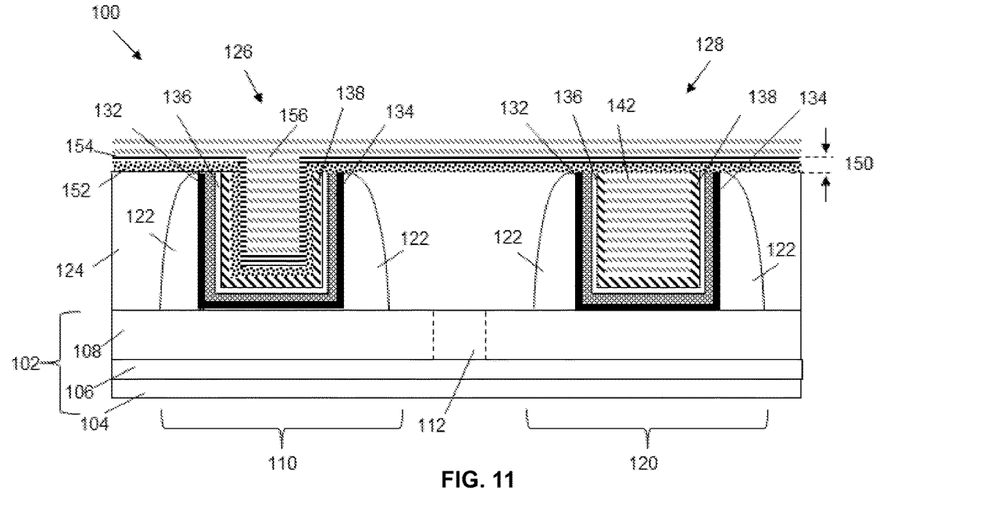
Figure 12:
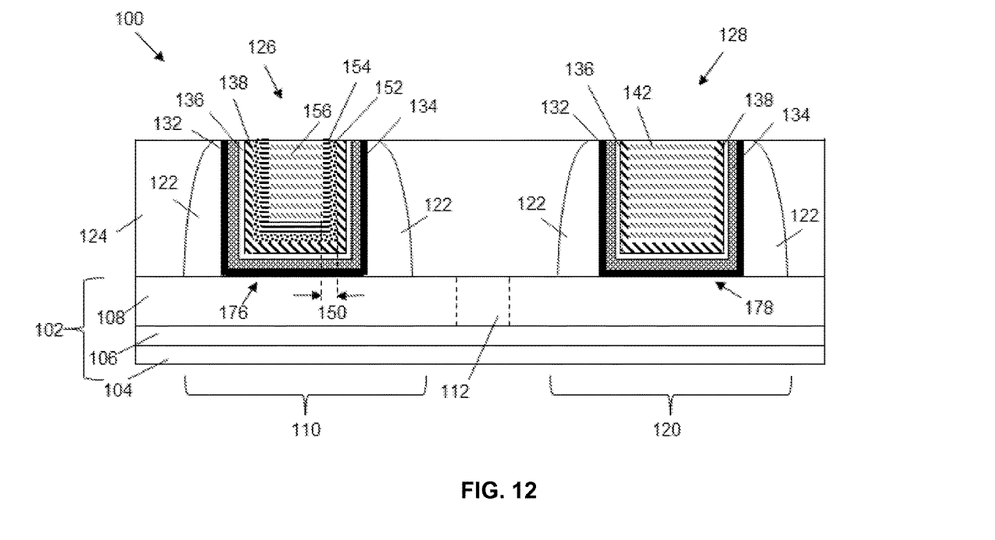

FIGS. 10-12 show an alternative embodiment to that which is shown in FIGS. 5-9. In this embodiment, after IC structure 100 is planarized (as discussed herein with respect to FIG. 4), mask 146 may be formed over IC structure 100 and patterned to expose opening 126 over nFET region 110 as shown in FIG. 10. However, instead of removing both gate electrode layer 142 and pFET work function metal layer 142 as discussed herein with respect to FIG. 5, this embodiment includes removing gate electrode layer 142 from opening 126 over nFET region 110 while pFET work function metal layer 138 remains. Turning to FIG. 11, mask 146 may be removed and an nFET work function metal layer 150 may be formed over IC structure 100. NFET work function metal layer 150 may include a nFET metal layer 152 and a wetting layer 154 as described herein and may include the materials described herein for nFET metal layer 152 and wetting layer 154. NFET work function metal layer 150 may be formed over the exposed pFET work function metal layer 138. That is, nFET metal layer 152 may be formed over pFET work function metal layer 138 and wetting layer 154 may be formed over nFET metal layer 152 such that wetting layer 154 and nFET metal layer 152 together define nFET work function metal layer. After nFET metal work function layer 150 is formed, another gate electrode layer 156 may be formed over nFET metal work function layer 150 or more particularly, wetting layer 154, to substantially fill opening 126.

As shown in FIG. 12, after gate electrode layer 156 is formed, IC structure 100 may be planarized such that any material outside of openings 126, 128 is removed. The resulting gate stacks (hereinafter, "replacement gate stacks") 166, 168 in nFET region 110 and pFET region 120 are of distinct compositions. Replacement gate stack 178 in pFET region 120 includes interfacial layer 132 in opening 128 within ILD layer 124, high-k layer 134 over interfacial layer 132, high-k cap layer 136 over high-k layer 134, pFET work function metal layer 138 over high-k cap layer 136, and gate electrode layer 142. Replacement gate stack 176 in nFET region 110 includes interfacial layer 132 in opening 126 within ILD layer 124, high-k layer 134 over interfacial layer 132, high-k cap layer 136 over high-k layer 134, pFET work function metal layer 138, nFET work function metal layer 150 over pFET work function metal layer 138, and gate electrode layer 156. As discussed herein, nFET work function metal layer 150 may include nFET metal layer 152 over pFET metal layer 138 and wetting layer 154 over nFET metal layer 152. As also discussed herein, high-k cap layer 136 is optional and may not be included in some embodiments.

It is to be understood that gate electrode layer 142 and gate electrode layer 156 may be of the same composition or different compositions. For example, in one embodiment, gate electrode layer 142 may include tungsten (W) and gate electrode layer 156 may include titanium nitride (TiN). In another embodiment, gate electrode layer 142 may include tungsten (W) and gate electrode layer 156 may include aluminum (Al).

Figure 13:
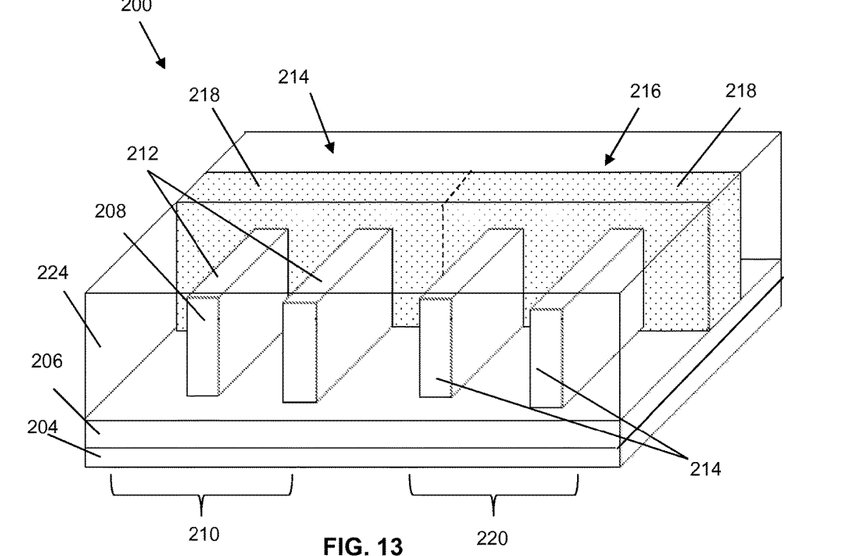
FIGS. 13-14 each show a three dimensional view of a fin-shaped field-effect transistor.

Referring now to FIGS. 13-20, the present disclosure may also apply to a fin-shaped field-effect transistor (FINFET). It is to be understood that materials used for any of the layers described with respect to this embodiment may include any of the materials listed with respect to their corresponding layers described herein, but have been removed in the description of the following embodiments for brevity. FIG. 13 shows IC structure as a FINFET 200. FIG. 13 shows an FINFET 200 that has undergone preliminary steps leading up to the methods according to embodiment of the disclosure. FINFET 200 may include a n-type field effect transistor (nFET) region 210 and a p-type field-effect transistor (pFET) region 220. PFET region 210 and nFET region 210 may be laterally adjacent to one another on a semiconductor layer 204. Overlying semiconductor layer 204 may be a buried oxide (BOX) layer 206, and overlying BOX layer 206 may be a silicon-on-insulator (SOI) layer 208 as discussed herein with reference to FIG. 1. Semiconductor layer 204, BOX layer 206, and SOI layer 208 may include any of the materials discussed with respect to FIG. 1. Fins 212, 214 may be formed in both pFET region 220 and nFET region 210 from SOI layer 208 as known in the art, e.g., via conventional etching and masking techniques.

Figure 14:
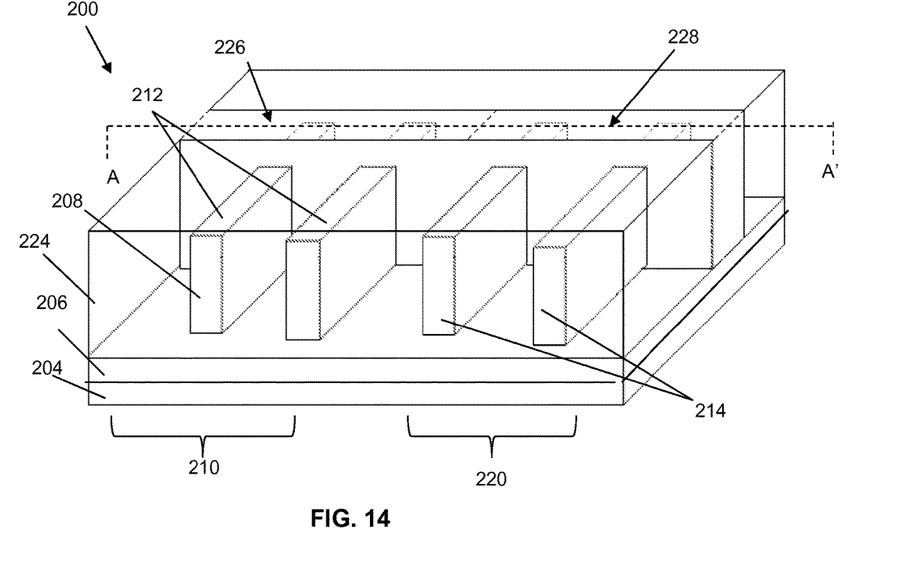

After fins 212, 214 are formed, gates 214, 216, i.e. dummy gates, may be formed. An interlayer dielectric (ILD) layer 224 may be deposited over gates 214, 216 as described with reference to FIG. 1. Gates 214, 216 in the form of dummy gates allow other processing steps, e.g., adjacent contact creation, to be carried out without damaging an eventual metal gate that will replace the dummy gate. Referring to FIGS. 13-14 together, gates 214, 216 may be removed to create openings 226, 228 in ILD layer 224 in which replacement gate stacks may be formed as described herein. That is, sacrificial material 218 of gates 214, 216 may be removed by an etch selective to sacrificial material 218 leaving openings 226, 228. Opening 226 may be positioned over nFET region 210, and opening 228 may be positioned over pFET region 220.

Figure 15:
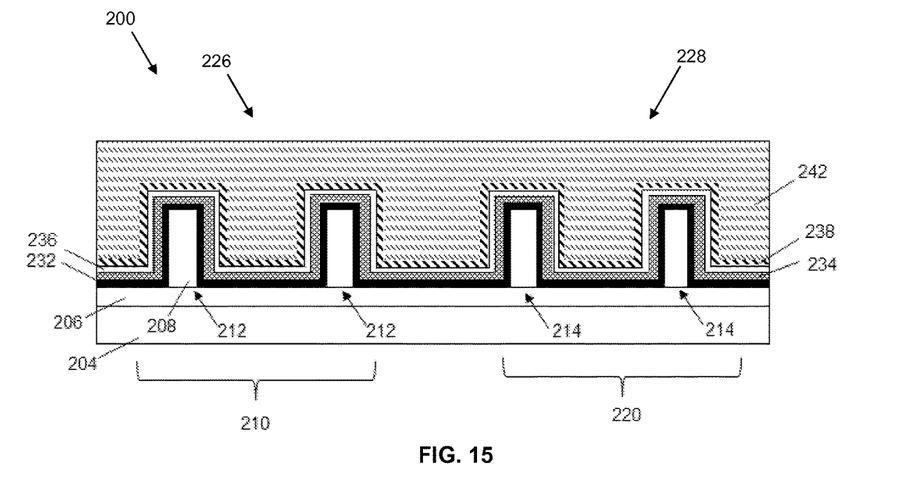
FIGS. 15-20 each show a cross-sectional view of a p-type fin-shaped field-effect transistor and a n-type fin-shaped field-effect transistor undergoing aspect of another method as described herein.

FIG. 15 shows a cross-section of FINFET 200 along line A-A of FIG. 14. Referring now to FIG. 15, an interfacial layer 232 may be formed over FINFET 200 to substantially coat each fin 212, 214 within each opening 226, 228. Subsequently, a high-k layer 234 may be formed over interfacial layer 132. After forming interfacial layer 232 and high-k layer 234, a thermal treatment process, such as a laser anneal, may be performed. Additionally, an optional high-k cap layer 236 may be formed over high-k layer 234. A pFET work function metal layer 238 may be formed over high-k cap layer 236 or directly over high-k layer 234 in an embodiment where high-k cap layer 236 is not included. Further, a gate electrode layer 242 may be formed over pFET work function metal layer 238 to substantially fill each opening 226, 228, followed by a planarization.

Figure 16:
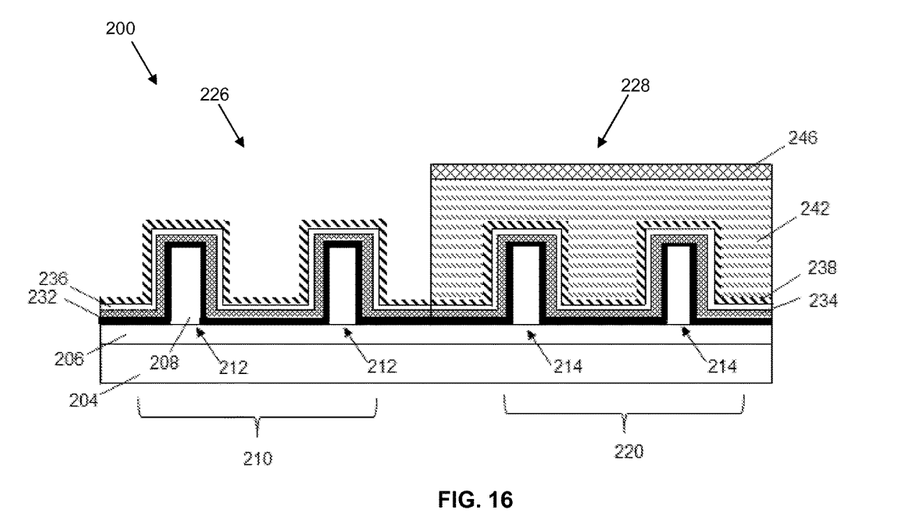
Figure 17:
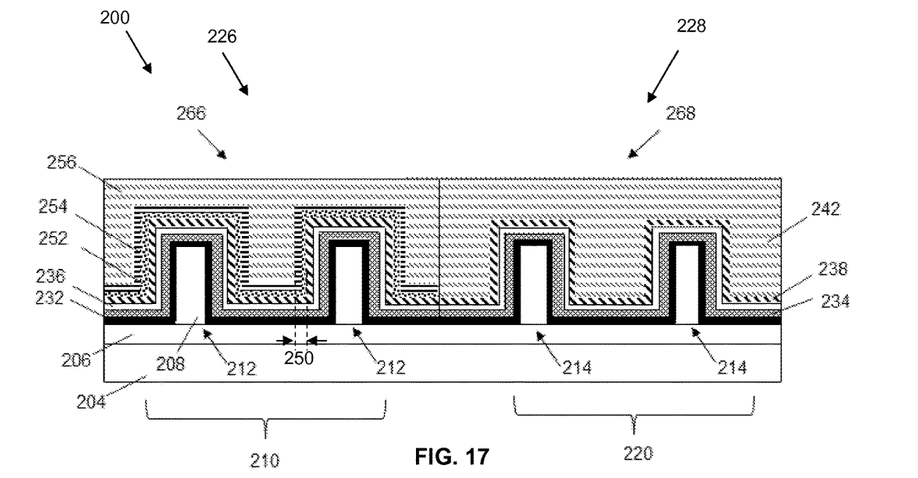

FIGS. 16-17, show one embodiment of FINFET 200 according to aspects of the method. In this embodiment, a mask 246 may be formed over gate electrode layer 242 and patterned to expose nFET region 210 as shown in FIG. 16. Gate electrode layer 242 may be removed to expose pFET work function metal layer 238 in opening 226. Subsequently, an nFET work function metal layer 250 may be formed over fins 212 in nFET region 210 as shown in FIG. 17.

In this embodiment, the resulting replacement gate stacks 266, 288 over nFET region 210 and pFET region 220, respectively, may have distinct compositions. Replacement gate stack 268 in pFET region 220 includes interfacial layer 232 over fins 214 within opening 228 in ILD layer 224, high-k layer 234 over interfacial layer 232, high-k cap layer 236 over high-k layer 234, pFET work function metal layer 238 over high-k cap layer 236, and gate electrode layer 242. Replacement gate stack 266 in nFET region 210 includes interfacial layer 232 over fins 212 within opening 226 in ILD layer 224, high-k layer 234 over interfacial layer 232, high-k cap layer 236 over high-k layer 134, nFET work function metal layer 250 over pFET work function metal layer 238, and gate electrode layer 256 over nFET work function metal layer 250.

It is to be understood that gate electrode layer 242 and gate electrode layer 256 may be of the same composition or different compositions. For example, in one embodiment, gate electrode layer 242 may include tungsten (W) and gate electrode layer 256 may include titanium nitride (TiN). In another embodiment, gate electrode layer 242 may include tungsten (W) and gate electrode layer 256 may include aluminum (Al).

Figure 18:
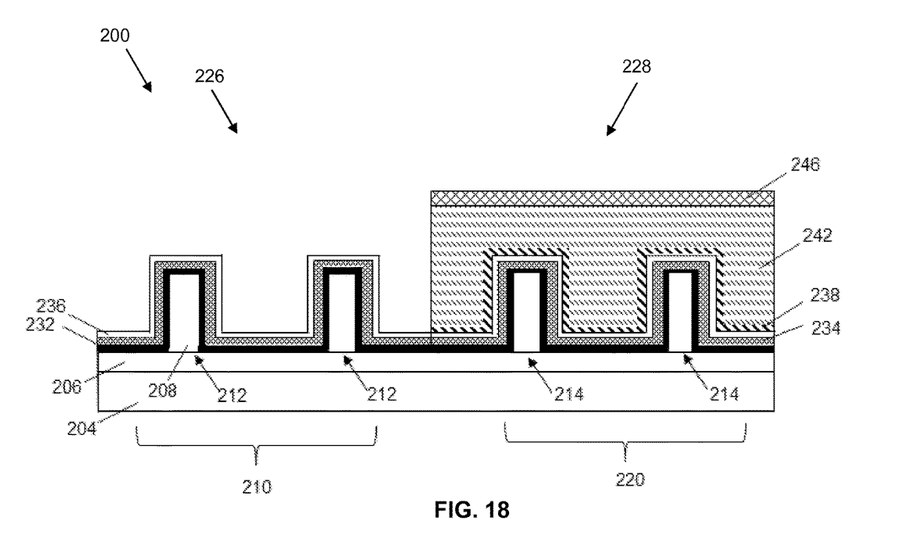
Figure 19:
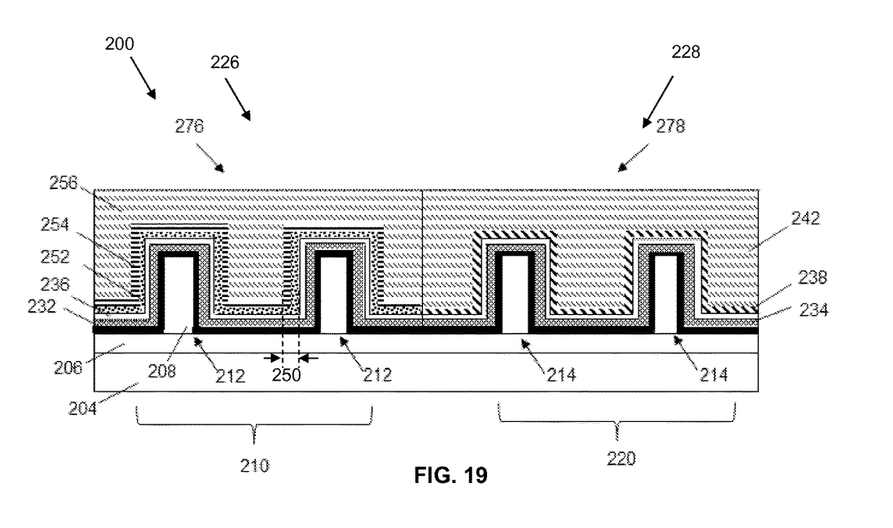
Figure 20:
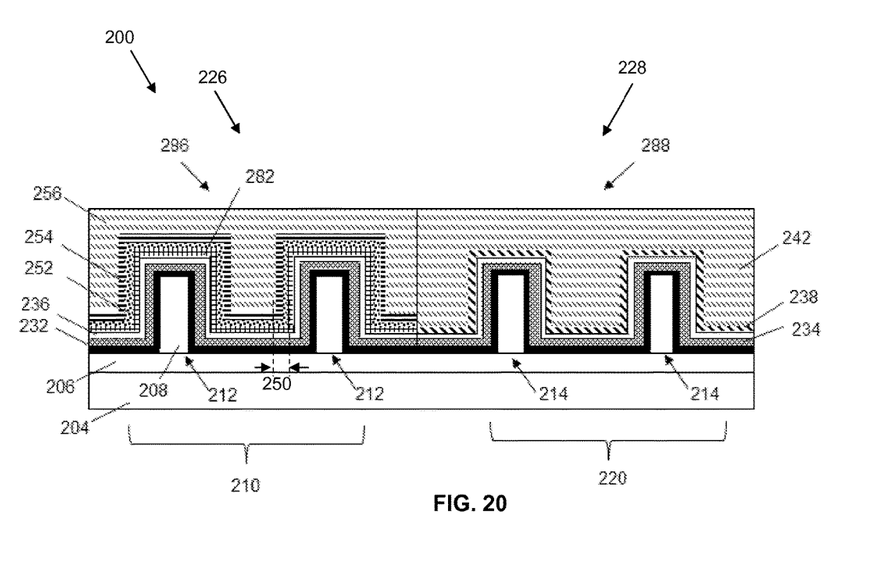

In another embodiment, as shown in FIGS. 18-20, both gate electrode layer 242 and pFET work function metal layer 238 may be removed from opening 226 to expose high-k cap layer 236, or in an embodiment where high-k cap layer 238 is not included, to expose high-k layer 234. NFET work function metal layer 250 may be formed over the exposed high-k cap layer 236, or in an embodiment where high-k cap layer 238 is not included, over high-k layer 234. As discussed herein, nFET work function metal layer 250 may include a nFET metal layer 252 and a wetting layer 254. That is, nFET metal layer 252 may be formed over high-k cap layer 236, or over high-k layer 234 in an embodiment where high-k cap layer 236 is not included, and wetting layer 254 may be formed over nFET metal layer 252. Further, another gate electrode layer 256 may be formed over nFET work function metal layer 250, or more specifically, over wetting layer 254. Gate electrode layer 256 may substantially fill opening 226 in nFET region 210.

In this embodiment, the resulting replacement gate stacks 276, 278 over nFET region 210 and pFET region 220, respectively, may have distinct compositions. As shown in FIG. 19, replacement gate stack 278 in pFET region 220 includes interfacial layer 132 over fins 214 within opening 228 in ILD layer 224, high-k layer 234 over interfacial layer 232, high-k cap layer 236 over high-k layer 234, pFET work function metal layer 238 over high-k cap layer 236, and a gate electrode layer 242. Replacement gate stack 276 in nFET region 210 includes interfacial layer 232 over fins 212 within opening 226 in ILD layer 224, high-k layer 234 over interfacial layer 232, high-k cap layer 236 over high-k layer 134, nFET work function metal layer 250 over high-k cap layer 236, and gate electrode layer 256 over nFET metal work function layer 250.

Referring to FIG. 20, in another embodiment, a barrier layer 282 may be formed after the removal of gate electrode 242 and pFET work function metal layer 238 from opening 226 in nFET region 210. This embodiment may be alternative to the embodiment shown in FIG. 19. As shown in FIG. 20, prior to forming nFET work function metal layer 250, barrier layer 282 may be formed over high-k cap layer 236, or over high-k layer 234 in an embodiment where high-k cap layer 236 is not included. After barrier layer 282 is formed, nFET work function metal layer 250 may be formed over barrier layer 282 in opening 226. That is, nFET metal layer 252 may be formed over barrier layer 282 and wetting layer 254 may be formed over nFET metal layer 252. After nFET work function metal layer 250 is formed, gate electrode layer 256 may be formed as described herein. Gate electrode layer 256 may substantially fill opening 226 in nFET region 210.

In this embodiment, the resulting replacement gate stacks 286, 288 in nFET region 210 and pFET region 220 are of distinct compositions. Replacement gate stack 288 in pFET region 220 includes interfacial layer 232 over fins 214 within opening 228 in ILD 224, high-k layer 234 over interfacial layer 232, high-k cap layer 236 over high-k layer 234, pFET work function metal layer 238 over high-k cap layer 236, and gate electrode layer 242. Replacement gate stack 286 in nFET region 210 includes interfacial layer 232 over fins 212 within opening 226 in ILD 224, high-k layer 234 over interfacial layer 232, high-k cap layer 236 over high-k layer 234, barrier layer 282 over high-k cap layer 236, nFET work function metal layer 250 over barrier layer 282, and gate electrode layer 256. As discussed herein, nFET work function metal layer 150 may include nFET metal layer 252 over high-k cap layer 236 and wetting layer 254 over nFET metal layer 252. As also discussed herein, high-k cap layer 236 is optional and may not be included in some embodiments.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of forming a replacement gate stack for a p-type field-effect transistor (pFET) and an n-type field-effect transistor (nFET), the method comprising:
    forming an interfacial layer in a first opening over a pFET region and a second opening over a nFET region, each of the first and second openings being positioned in a dielectric layer over the pFET region and the nFET region;
    forming a high-k layer over the interfacial layer in each opening;
    forming a pFET work function metal layer over the high-k layer in each opening;
    forming a first gate electrode layer over the pFET work function metal layer to substantially fill each of the first and second openings, thereby forming a first replacement gate stack for the pFET;
    removing the first gate electrode layer from the second opening;
    forming an nFET work function metal layer in the second opening after the removing of the first gate electrode from the second opening; and
    forming a second gate electrode layer over the nFET work function metal layer, thereby forming a second replacement gate stack for the nFET.

2. The method of claim 1, further comprising:
    prior to the forming of the nFET work function metal layer, removing the pFET work function metal layer from the second opening to expose the high-k layer thereunder,
    wherein the forming of the nFET work function metal layer includes forming the nFET work function metal layer over the exposed high-k layer in the second opening.

3. The method of claim 1, further comprising:
    prior to the forming of the pFET work function metal layer, forming a high-k cap layer over the high-k layer and removing the pFET work function metal layer from the second opening to expose the high-k cap layer,
    wherein the forming of the nFET work function metal layer includes forming the nFET work function metal layer over the exposed high-k cap layer in the second opening.

4. The method of claim 3, wherein the forming the high-k cap layer includes depositing at least one of: tantalum nitride and titanium nitride.

5. The method of claim 1, wherein the forming the high-k layer includes growing hafnium oxide.

6. The method of claim 1, further comprising:
    prior to the forming of the pFET work function metal layer, performing an anneal.

7. The method of claim 1, wherein the forming the interfacial layer includes forming the interfacial layer over a set of fins in each of the pFET region and the nFET region.

8. The method of claim 1, further comprising:
    prior to forming the nFET work function metal layer in the second opening, removing the pFET work function metal layer from the second opening.

9. The method of claim 8, further comprising:
    forming a barrier layer over the high-k layer in the second opening; and
    wherein the forming the nFET work function metal layer includes forming the nFET work function metal layer over the barrier layer.

10. The method of claim 1, wherein the forming of the nFET work function metal layer includes:
    forming an nFET metal layer in the second opening, and
    forming a wetting layer over the nFET metal layer.

11. The method of claim 10, wherein the forming of the nFET metal includes depositing one of: titanium aluminum, aluminum, titanium aluminum carbon, or titanium, and
    wherein the forming the wetting layer includes depositing titanium nitride.

12. The method of claim 1, wherein the forming of the pFET work function metal layer includes depositing titanium nitride.

13. The method of claim 1, wherein the forming the first gate electrode layer includes depositing tungsten, and
    wherein the forming the second gate electrode layer includes depositing one of: titanium nitride or aluminum.

* * * * *